United States Patent [19]
Williams et al.

[11] Patent Number: 5,621,355
[45] Date of Patent: Apr. 15, 1997

[54] SAMPLED DATA-BIASING OF CONTINUOUS TIME INTEGRATED CIRCUIT

[75] Inventors: Brian E. Williams, Melbourne, Fla.; Timothy J. Johnson, Mundelein, Ill.

[73] Assignee: Harris Corporation, Melbourne, Fla.

[21] Appl. No.: 537,051

[22] Filed: Sep. 29, 1995

[51] Int. Cl.⁶ .................................................. H03F 1/34
[52] U.S. Cl. ........................................ 330/107; 327/554
[58] Field of Search ................................. 330/107, 303, 330/305, 306; 327/552, 553, 554, 558

[56] References Cited

U.S. PATENT DOCUMENTS

| | | | |
|---|---|---|---|
| 4,924,189 | 5/1990 | Senn et al. ........................... | 327/554 X |
| 5,124,593 | 6/1992 | Michel ................................. | 307/521 |
| 5,491,447 | 2/1996 | Goetschel et al. ................... | 330/305 X |

OTHER PUBLICATIONS

"A 20–MHz Sixth–Order BiCMOS Parasitic–Insensitive Continuous–Time Filter and Second–Order Equalizer Optimized for Disk–Drive Read Channels" by Carlos A Laber and Paul R. Gray, *IEEE Journal of Solid–State Circuits*. vol. 28, No. 4, Apr., 1993.

"A 2–μm CMOS Fifth–Order Low–Pass Continuous–Time Filter for Video–Frequency Applications" by Bruno Stefanelli and Andreas Kaiser, *IEEE Journal of Solid–State Circuits*, vol. 28, No. 7, Jul., 1993.

"Gyrator Video Filter IC with Automatic Tuning" by Kenneth W. Moulding et al., *IEEE Journal of Solid–State Circuits*, Vol. SC–15, No. 6, Dec., 1980.

"Design of a 15–MHz CMOS Continuous–Time Filter with On–Chip Tuning" by John M. Khoury, *IEEE Journal of Solid–State Circuits*, vol. 26, No. 12, Dec. 1991.

"Design Considerations for High–Frequency Continuous–Time Filters and Implementation of an Antialiasing Filter for Digital Video" by Venugopal Gopinathan et al., *IEEE Journal of Solid–State Circuits*, vol. 25, No. 6, Dec., 1990.

"CMOS Active Filter Design at Very High Frequencies" by Yun–Ti Wang, *IEEE Journal of Solid–State Circuits*, vol. 25, No. 6, Dec., 1990.

"A 4–MHz CMOS Continuous–Time Filter with On–Chip Automatic Tuning" by Francois Krummenacher and Norbert Joehl, *IEEE Journal of Solid–State Circuits*, vol. 23, No. 3, Jun., 1988.

"Design of a 4–MHz Analog Integrated CMOS Transconductance–C Bandpass Filter" by Chin S. Park and Rolf Schaumann, *IEEE Journal of Solid–State Circuits*, vol. 23, No. 4, Aug., 1988.

"High–Frequency CMOS Continuous–Time Filters" by Haideh Khorramabadi and Paul R. Gray, *IEEE Journal of Solid–State Circuits*, vol. SC–19, No. 6, Dec., 1984.

"An Elliptic Continuous–Time CMOS Filter with On–Chip Automatic Tuning" by Banu and Tsividis, *IEEE Journal of Solid–State Circuits*, vol. SC–20, No. 6, Dec., 1985, pp. 1114–1121.

*Primary Examiner*—Steven Mottola
*Attorney, Agent, or Firm*—Charles E. Wands

[57] ABSTRACT

Process-dependent characteristics of a continuous time circuit, e.g., particular the sensitivity of the corner frequency of a continuous time filter to variations in absolute capacitance, is obviated by modifying a resistance-based transconductance tuning circuit, so that the tuning resistor is replaced with a switched capacitor circuit. The effect of this switched sampled data resistor replacement is such that, if each of the resistor-simulating switched capacitor of the transconductance stage and one or more load capacitors of the filter is established in the same processing sequence, what would otherwise be process-sensitive terms in the corner frequency-establishing ratio ($g_m/C$) effectively cancel each other, so that the corner frequency fhi becomes proportional to a readily controlled frequency parameter for the sampled data resistor.

16 Claims, 3 Drawing Sheets

SAMPLED DATA-BIASING OF CONTINUOUS TIME INTEGRATED CIRCUIT

FIELD OF THE INVENTION

The present invention relates in general continuous time integrated circuits, and is particularly directed to an improved on-chip filter circuit, comprised of at least one transconductance stage and an associated (passive) load component therefor (e.g. capacitor), with the transconductance stage containing a sampled data resistor (switched capacitor) component for defining the transconductance, such that the transfer function (in particular the corner frequency) of the filter is dependent only upon a readily controllable parameter—the switching frequency of the sampled data resistor—rather than a processed component (absolute capacitance), thereby making the behavior of the filter insensitive to processing variations.

BACKGROUND OF THE INVENTION

The design and manufacture of (telecommunication) signal processing circuits implemented by the use of integrated circuit technology is typically limited by absolute device characteristics, which are ordinarily not well controlled, due to processing variations among different wafer batches. In an effort to circumvent this limitation, integrated circuit designers may take advantage of the ability to match multiple like devices on the same chip, which results in several orders of magnitude of reduction in the variation of characteristics of absolute devices resident in wafers obtained during separate processing runs. Namely, by designing circuit architectures whose critical parameters depend only upon on-chip device matching, such circuits can be made to be effectively insensitive to absolute device characteristics.

One type of circuit that takes advantage of such device matching on a single chip is a sampled data circuit, such as that used to construct highly accurate (telecommunication signal processing) filters, whose corner frequencies are dependent upon device matching, rather than absolute device parameters. However, a shortcoming of such sampled data filter circuits is the fact that their use is limited to low bandwidth applications (below a few hundred kilohertz), since parasitic components (capacitances) limit their maximum operating frequency. At higher frequencies it becomes necessary to use continuous time techniques, such as $g_m/C$ and MOSFET/C architectures, or other tunable R/C filter mechanisms in order to avoid the parasitic problem.

One example of a continuous time circuit that is commonly employed in high frequency filters is diagrammatically illustrated in FIG. 1, and comprises an integrator stage 10 formed of a combination of a transconductance ($g_m$) stage 11 and a load element, in particular an integrating capacitor ($C_L$) 13. The transconductance ($g_m$) stage 11 contains a transconductance element which produces an output current $I_{gm}$, that is proportional to a voltage Vin applied to input terminal 12. With the output current $I_{gm}$ of transconductance stage 11 being applied to an output terminal 14, to which the load capacitor ($C_L$) 13 is coupled and from which an output voltage Vout is derived, then the transfer function of the integrator stage 10 of FIG. 1 may defined by the equation:

$$\text{Vout/Vin} = g_m/sC_L. \tag{1}$$

By connecting two of the integrator stages of FIG. 1 in cascade, as diagrammatically illustrated in FIG. 2, a simple first-order low-pass filter may be realized. As shown therein, first and second transconductance stages 11-1 and 11-2 are coupled in cascaded between an input terminal 12 and output terminal 14. The respective output currents $I_{gm1}$ and $I_{gm2}$ produced by stages 11-1 and 11-2 are summed at output terminal 14, so that the overall transfer function of the low-pass filter of FIG. 2 may be defined by the equation:

$$\text{Vout/Vin} = (g_{m1}/g_{m2})*(1/(1+sC_L/g_{m2})). \tag{2}$$

From equation (2) it can be seen that the pole frequency is process-dependent, since it is determined by the ratio of the process-dependent terms: $g_{m2}/C_L$. It is not atypical for the absolute accuracy of either process-dependent term to vary on the order of +/−20% over all process and temperature extremes. Since, in most cases, such a variation in the filter's corner frequency is unacceptable, on-chip compensation is necessary, in order to force the transconductance-to-capacitance ratio to fall within predetermined limits. Such compensation is ordinarily provided by means of an auxiliary phase-lock loop, with $g_m$ being tuned so as to lock a $g_m$-controlled master local oscillator to a reference frequency with a $g_m$-based control voltage being employed to drive a slave $g_m$ stage. This tuning scheme used sets $g_m*C$ of slave filter stages, such that the corner frequency of the filter is at the desired value. For a description of an example of such a tuning circuit, attention may be directed to the article by F. Krummenacher et al, entitled: "A 4 MHz CMOS Continuous-Time Filter with On-Chip Automatic Tuning," IEEE Journal of Solid-State Circuits, VOL. 23, NO. 3, Jun., 1988, pp 750–758. Unfortunately, dedicating such a phase-locked loop tuning circuit for processing variation compensation adds considerable additional semiconductor real estate and circuit complexity, thereby increasing circuit cost.

FIG. 3 diagrammatically illustrates one proposed alternative transconductance control circuit configuration, described in an article by C. Laber et al, entitled: "A 20 MHz Sixth Order BiCMOS Parasitic-Insensitive Continuous-Time Filter and Second Order Equalizer for Disk-Drive Read Channels," IEEE Journal of Solid State Circuits, Vol. SC-28, pp 462–470, April 1993, which makes it possible to tune $g_m$ by means of a very precise control mechanism that is independent of chip processing parameters. The Laber et al control mechanism involves the use of a precisely controllable external resistor Rext, the value of which is effectively translated to a reference resistor within the circuit, that sets the operational parameters of the transconductance stage, such that the transconductance $g_m$ is defined by n/Rext, where n is a scaling factor established by a current feedback loop.

More particularly, the transconductance control circuit of FIG. 3 comprises a first current source 21, which is coupled in circuit with an external reference resistor 23 between first and second DC voltage supply terminals 25 and 27. The first current source 21 is operative to generate a current having a value of δI, and the value of external reference resistor 23 is denoted as Rext. Thus, the voltage at node 26 of external reference resistor 23 is δI*Rext.

Node 26 of external resistor 23 is coupled to a first input 31 of an operational amplifier 30, the output 33 of which is coupled to the control gate 35 of a MOSFET 36. MOSFET 36 has its source-drain current flow path coupled in circuit with a current mirror circuit 40 and an internal reference resistor 43, having a resistance value Rint, which is coupled between a node 45 and the DC voltage supply terminal 27. Node 45 is coupled in a feedback path to a second input 32 of operational amplifier 30. As a consequence, the voltage delta δI*Rext across the external resistor 23 is effectively transferred across internal reference resistor 43, so that the current $I_{Rint}$ through internal reference resistor 43 is $\delta I*Rext/Rint$.

Current mirror circuit 40 replicates the current $I_{Rint}$ through a circuit path containing a pair of series-connected resistors 51 and 52, the value of each of which is set equal to half the value of resistor 43, namely Rint/2. The node 53 between resistors 51 and 52 is coupled to a first input 54 of an operational amplifier 60, a second input 55 of which is coupled to receive a reference voltage Vcm. The output 57 of amplifier 60 is coupled to the control gate of MOSFET 62, which has its source-drain path coupled in circuit with series connected resistors 51 and 52 and voltage supply terminal 27. Resistors 51 and 52 are coupled to respective inputs 63 and 65 of a transconductance stage 68. Transconductance stage 68 has its output 69 coupled to an output node 71, which is coupled via link 73 to a $g_m$ adjustment input 75 of stage 68 and to a current generator 80. Current generator 80 is operative to apply a current $\delta I*n$, where n is a scaling factor, to a current mirror control loop 81.

In operation, with the resistance value Rext of external resistor 23 being translated to internal reference resistor 43, current mirror 40 applies a current $\delta I*Rext/Rint$ through the path containing series-connected input resistors 51 and 52 of transconductance stage 68. As a result, the input voltage applied to transconductance stage 68 is $(\delta I*Rext/Rint) * (Rint/2+Rint/2)$ or $\delta I*Rext$. The output current generated by transconductance stage 68 is therefore $g_{m68} * \delta I*Rext$. Because of the current feedback loop provided by current generator 80, the output current of transconductance stage 68 is forced to be equal to $\delta I*Rext*n$, so that $g_{m68}$ is forced to be equal to n/Rext. In other words, the external resistance transfer and current mirror feedback mechanisms of the circuit of FIG. 3 enables the transconductance $g_{m68}$ of stage 68 to be readily established by means of a well defined external resistance value Rext (multiplied by a prescribed scaling factor n), so that one component (the $g_m$ component) of the dual variable integrator stage described above with reference to FIG. 1 can be precisely controlled, independent of processing parameters of the components of the transconductance stage.

However, since the remaining component—the integrating (load) capacitor C—is subject to processing parameter variations, the overall behavior of the filter circuit is still dependent upon such processing variations, so that, as noted above, the corner frequency may shift by as much as twenty percent in extreme cases.

SUMMARY OF THE INVENTION

In accordance with the present invention, this secondary shortcoming of the proposed external resistance-based transconductance tuning circuit approach of FIG. 3 is effectively obviated by replacing its external tuning resistor component of the transconductance stage with a sampled data resistor. The value of the sampled data resistor can be readily controlled by a precision frequency generator, such that the transfer function (in particular the corner frequency) of the filter is dependent only upon a readily controllable parameter—the switching frequency of the sampled data resistor—rather than a processed component (absolute capacitance), thereby making the behavior of the filter insensitive to processing variations.

Advantageously, since the parameters of each of the sampled data resistor-simulating switched capacitor circuits of the transconductance stage, and one or more additional capacitors of the filter, which define its transfer characteristic (e.g. corner frequency), are established in the same processing sequence (mask set, doping parameters, etc.), the $g_m$ component of the above-referenced $g_{m2}/C_L$ ratio becomes a function of the same aspects of the process through which the value of $C_L$ is obtained. Consequently, process-sensitive terms in both the numerator and denominator of the corner frequency-establishing ratio ($g_{m2}C_L$) effectively cancel each other, whereby the overall transfer function of the filter can be made effectively insensitive to process variations.

DETAILED DESCRIPTION

Figure 3:
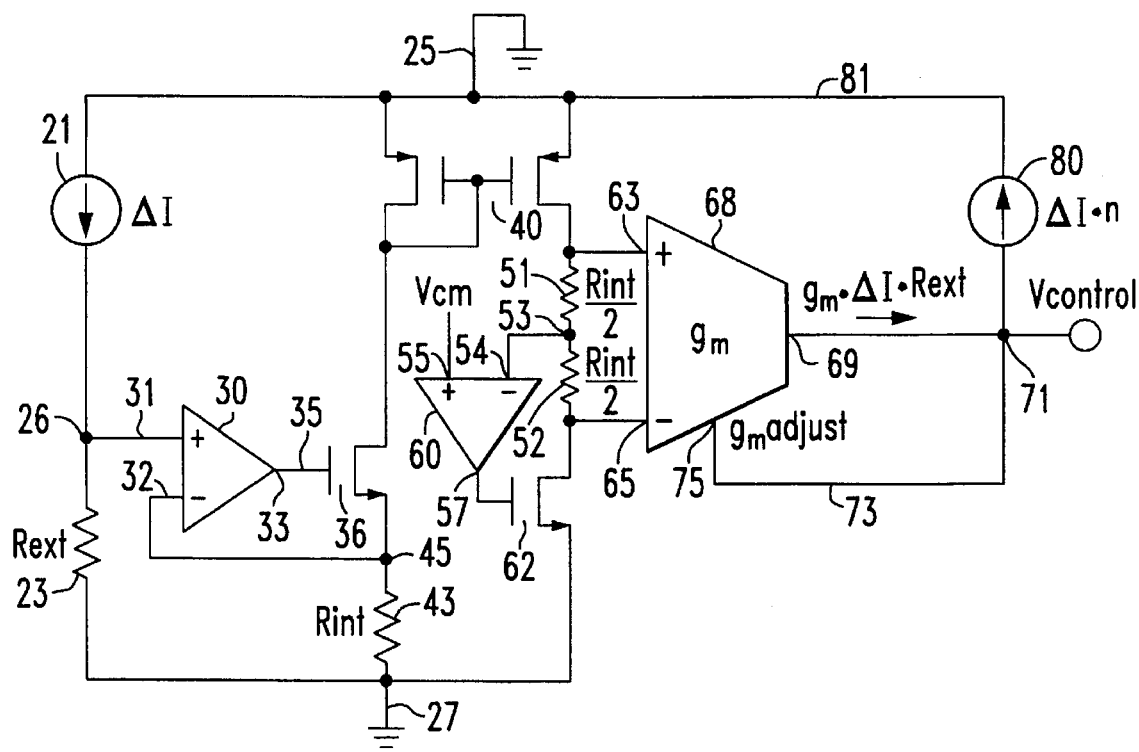
FIG. 3 diagrammatically illustrates a prior art transconductance control circuit configuration described in the above-cited article by C. Laber et al, entitled: "A 20 MHz Sixth Order BiCMOS Parasitic-Insensitive Continuous-Time Filter and Second Order Equalizer for Disk-Drive Read Channels," IEEE Journal of Solid State Circuits, Vol. SC-28, pp 462–470, April 1993.

As pointed out briefly above, the improved transconductance control circuit of the present invention involves a modification of the transconductance stage, such that the overall transfer function (in particular the corner frequency) of the filter is dependent only upon a readily controllable parameter—the switching frequency of the sampled data resistor—rather than a processed component (absolute capacitance), thereby making the behavior of the filter insensitive to processing variations. To this end, the present invention involves making the transconductance a function of what would otherwise be a process-dependent variable (absolute capacitance), by replacing the external control resistance of FIG. 3 with a sampled data resistor, that simulates the $g_m$-tuning resistor, so that transconductance becomes a function of the other component (capacitance) of the transfer function of the integration stage, and thereby effectively enables the capacitance component in the denominator to be cancelled out. What remains in its place is a variable (frequency) that is readily and precisely controlled.

The functional equivalence of a sampled data resistor and a switched capacitor, is well known, and the use of a sampled data resistor in another type continuous time integrated circuit filter—specifically, a continuous time MOSFET-C filter—is illustrated in the U.S. Patent to Michel, U.S. Pat. No. 5,124,593, issued Jun. 23, 1992. (In the Michel patent, the sample data resistor is adjusted so that the MOSFET operates in a linear range; it is not used to make filter corner frequency independent of absolute capacitance or insenstive to processing variations in a filter circuit comprised of a transconductance stage and a load capacitor, as described above.)

Figure 4:
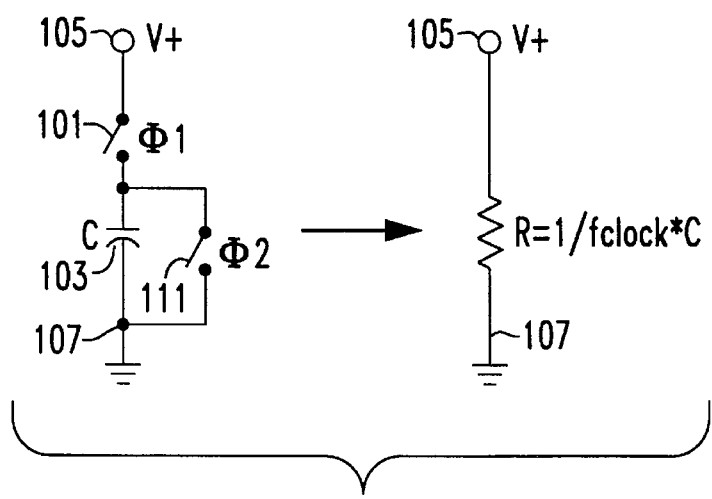
FIG. 4 diagrammatically illustrates the functional equivalence of a (sampled data) resistor and a switched capacitor.

The general circuit configuration of such a switched capacitor functioning as a sampled data resistor is also diagrammatically illustrated in FIG. 4. As shown therein, a first switch 101 is connected in a series circuit path with the 'switched' capacitor 103 between first and second nodes 105 and 107, while a second, capacitor-shorting switch 111 is coupled in parallel with the capacitor 103. Switches 101 and 111 may comprise respective MOSFET switches, with their gates being controlled by differential phase components $\Phi_1$ and $\Phi_2$ of a prescribed switching frequency.

Figure 5:
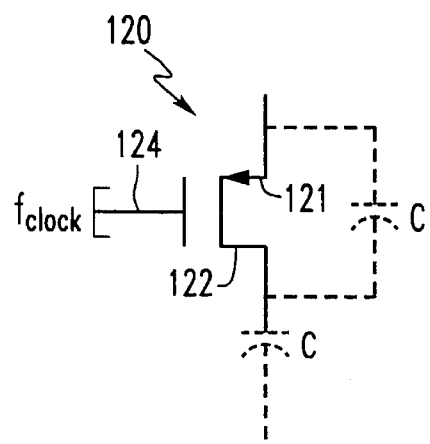
FIG. 5 diagrammatically illustrates a MOSFET switch having its source-drain current flow path controlled by a prescribed clock (sampling) frequency, that is defined in accordance with the intended parameters of the resistor-equivalent device.

FIG. 5 diagrammatically illustrates at 120 the coupling of such a MOSFET switch to a capacitor (shown in broken lines for alternative series and parallel connection configurations), the MOSFET switch 120 having its source-drain current flow path between source 121 and drain 122 controlled by a prescribed gate signal to its gate electrode 124, with the clock (sampling) frequency of the signal being defined in accordance with the intended parameters of the resistor-equivalent device. At frequencies well below the switching frequency of switches 101 and 111, the switched capacitor 103 of FIG. 4 simulates a sampled data resistance R that is inversely proportional to the switching frequency f and the value of the capacitance Csc of the capacitor. Thus, by replacing resistance 23 of the circuit of FIG. 3 with the sampled data resistor equivalent circuit of the switched capacitor of FIG. 4, as diagrammatically illustrated at 123 in FIG. 6, the output current $\delta I^*n$ generated by transconductance stage 68 now becomes:

$$\delta I^*n = g_{m68} * \delta I * (1/f*Csc). \quad (3)$$

Therefore, $g_{m68}$ is now defined as:

$$g_{m68} = n*f*Csc. \quad (4)$$

Figure 1:
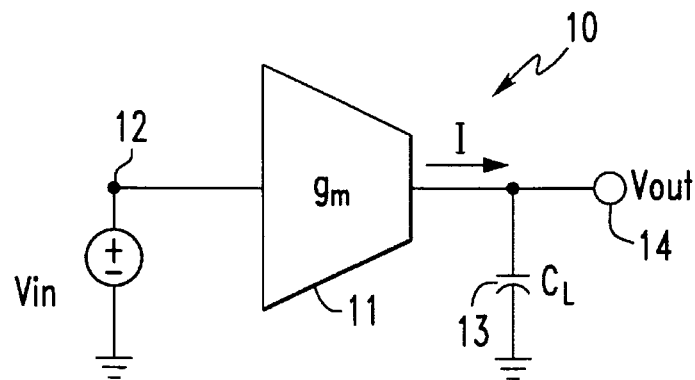
FIG. 1 diagrammatically illustrates an example of a continuous time circuit employed in high frequency filters.
Figure 2:
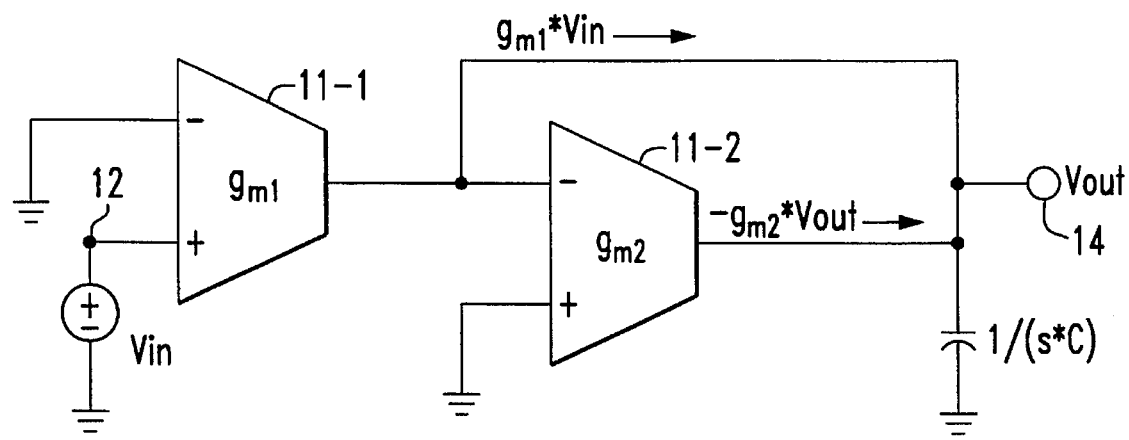
FIG. 2 diagrammatically illustrates the connection of two of the integrator stages of FIG. 1 in cascade to realize a simple first-order low-pass filter.
Figure 6:
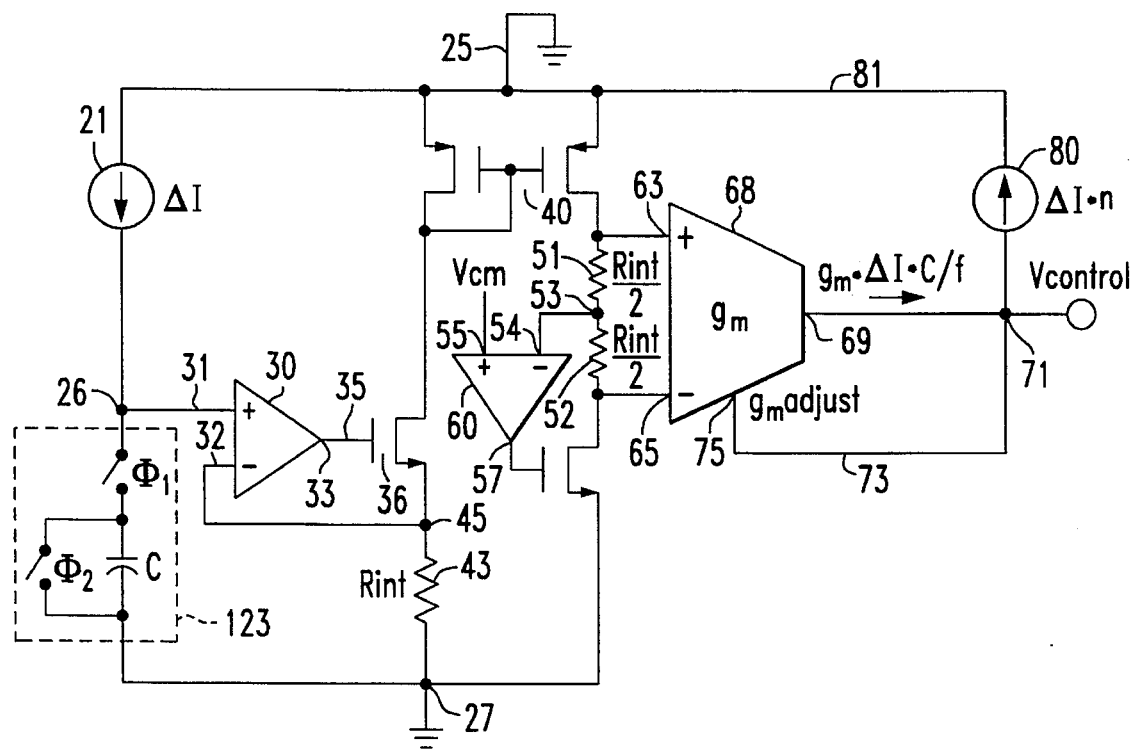
FIG. 6 diagrammatically illustrates a modification of the circuit of FIG. 3 in which the external transconductance-tuning resistance is replaced with the sampled data resistor equivalent circuit of the switched capacitor of FIG. 4.

When the sampled data resistor-controlled transconductance stage of FIG. 6 is employed in the integrator stage 10 of FIG. 1, the transfer function of the integrator stage becomes:

$$Vout/Vin = n*f*Css/sC_L. \quad (5)$$

In other words the corner frequency fhi, which is defined by $g_m/C_L$, now becomes:

$$fhi = n*f*Csc/C_L. \quad (6)$$

Thus, if the wafer parameters of each of the sampled data resistor-simulating switched capacitor (Csc) of the transconductance stage, and one or more additional (load) capacitors ($C_L$) of the filter are established in the same processing sequence (e.g., mask set, doping parameters, etc.), the process-sensitive terms in both the numerator and denominator of the corner frequency-establishing ratio ($g_m/C_L$) effectively cancel each other, so that the corner frequency fhi becomes n*f, where each of n and f is a readily controlled parameter. The switching frequency f may be derived from a precision clock reference (local oscillator) circuit customarily provided on the chip.

As will be appreciated from the foregoing description, the process-dependent characteristics of conventional continuous time circuits, in particular the sensitivity of the corner frequency of a continuous time filter, to variations in absolute capacitance, which ordinarily requires the use of an auxiliary phase-lock loop that entails considerable semiconductor real estate and circuit complexity, are effectively obviated in accordance with the present invention, by modifying a resistance-based transconductance tuning circuit, so that the tuning resistor is replaced with a sampled data resistor. The effect of this sampled data resistor replacement is such that, if the wafer parameters of each of the sampled data resistor-simulating switched capacitor of the transconductance stage and one or more load capacitors of the filter are established in the same processing sequence, what would otherwise be process-sensitive terms in the corner frequency-establishing ratio ($g_m/C$) effectively cancel each other, so that the corner frequency fhi becomes proportional to a readily controlled frequency parameter for the sampled data resistor.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed is:

1. A continuous time circuit comprising a transconductance stage and a load element coupled thereto, said transconductance stage producing an output current that is proportional to a voltage applied to an input terminal thereof, said output current being applied to an output terminal of said transconductance stage to which said load element is coupled and from which an output voltage is derived, such that said continuous time circuit has a transfer function that is defined by a prescribed relationship between transconductance and said load element, and wherein said transconductance stage includes a component through which the transconductance of said transconductance stage becomes a function of a prescribed property of said load element capacitance, that is effective to make said transfer function independent of said prescribed property.

2. A continuous time circuit according to claim 1, wherein said load element comprises a load capacitor, and said component of said transconductance stage comprises a switched capacitor element.

3. A continuous time circuit according to claim 2, wherein said switched capacitor element is controlled at a switching frequency effective to cause said switched capacitor element to simulate a reference resistor, and is coupled to an input voltage control path of said transconductance stage, said transconductance stage having its output coupled through an output current generator to said input voltage control path of said transconductance stage, said output current generator producing an output current which is proportional to current applied to said switched capacitor element, such that the output current generated by transconductance stage is proportional to the product of current applied to said switched capacitor element and a reference resistance value of said switched capacitor element.

4. A continuous time circuit according to claim 2, wherein said transconductance stage comprises a first current source, which is coupled in circuit with said switched capacitor element and is operative to apply a first current thereto, and wherein said switched capacitor element is controlled at a switching frequency effective to cause said switched capacitor element to simulate a first reference resistor, whereby the voltage across said first reference resistor is dependent upon the value of said first reference resistor and said first current, and a voltage translation circuit which applies the value of the voltage across said first reference resistor simulated by said switched capacitor element to an input voltage control path of said transconductance stage, said transconductance stage having its output coupled through a second current generator to said input voltage control path of said transconductance stage, said second current generator producing a second current which is proportional to said first current, such that the output current generated by transconductance stage is proportional to the product of said first current and the simulated first reference resistance value of said switched capacitor element.

5. A continuous time circuit comprising a transconductance $g_m$ stage and a load capacitor $C_L$ coupled thereto, said transconductance $g_m$ stage containing a transconductance element which produces an output current $I_{gm}$, that is proportional to a voltage applied to an input terminal thereof, said output current $I_{gm}$ being applied to an output terminal of said transconductance stage to which said load capacitor $C_L$ is coupled and from which an output voltage Vout is derived, such that said continuous time circuit has a transfer function Vout/Vin defined by a ratio of $g_m$ to $C_L$, and wherein said transconductance stage includes a capacitive component through which the transconductance $g_m$ of said transconductance stage is defined, so that said transconductance $g_m$ is function of capacitance, whereby said transfer function is effectively independent of absolute capacitance.

6. A continuous time circuit according to claim 5, wherein said capacitive component of said transconductance stage comprises a switched capacitor element.

7. A continuous time circuit according to claim 6, wherein said switched capacitor element is controlled at a switching frequency effective to cause said switched capacitor element to simulate a reference resistor, and is coupled to an input voltage control path of said transconductance stage, said transconductance stage having its output coupled through an output current generator to said input voltage control path of said transconductance stage, said output current generator producing an output current which is proportional to current applied to said switched capacitor element, such that the output current generated by transconductance stage is proportional to the product of current applied to said switched capacitor element and a reference resistance value of said switched capacitor element.

8. A continuous time circuit according to claim 6, wherein said transconductance stage comprises a first current source, which is coupled in circuit with said switched capacitor element and is operative to apply a first current thereto, and wherein said switched capacitor element is controlled at a switching frequency effective to cause said switched capacitor element to simulate a first reference resistor, whereby the voltage across said first reference resistor is dependent upon the value of said first reference resistor and said first current, and a voltage translation circuit which applies the value of the voltage across said first reference resistor simulated by said switched capacitor element to an input voltage control path of said transconductance stage, said transconductance stage having its output coupled through a second current generator to said input voltage control path of said transconductance stage, said second current generator producing a second current which is proportional to said first current, such that the output current generated by transconductance stage is proportional to the product of said first current and the simulated first reference resistance value of said switched capacitor element.

9. A continuous time filter circuit comprising at least one transconductance $g_m$ stage coupled in circuit between an input terminal to which an input voltage Vin is applied, and an output terminal from which an output voltage Vout is derived, a load capacitor $C_L$ coupled to said output terminal, said at least one transconductance $g_m$ stage containing a transconductance element which produces an output current $I_{gm}$, that is proportional to a voltage applied to said input terminal thereof, said output current $I_{gm}$ being applied to said output terminal, such that said continuous time circuit has a transfer function Vout/Vin defined by a ratio of $g_m$ and $C_L$, and wherein said at least one transconductance stage includes a capacitive component through which the transconductance $g_m$ of said at least one transconductance stage is defined, such that said transfer function is effectively independent of absolute capacitance.

10. A continuous time filter circuit according to claim 9, wherein said capacitive component of said at least one transconductance stage comprises a switched capacitor element.

11. A continuous time filter circuit according to claim 10, wherein said at-least one transconductance stage comprises a first current source, which is coupled in circuit with said switched capacitor element and is operative to apply a first current thereto, and wherein said switched capacitor element is controlled at a switching frequency effective to cause said switched capacitor element to simulate a first reference resistor, whereby the voltage across said first reference resistor is dependent upon the value of said first reference resistor and said first current, and a voltage translation circuit which applies the value of the voltage across said first reference resistor simulated by said switched capacitor element to an input voltage control path of said at least one transconductance stage, said at least one transconductance stage having its output coupled through a second current generator to said input voltage control path of said at least one transconductance stage, said second current generator producing a second current which is proportional to said first current, such that the output current generated by said at least one transconductance stage is proportional to the product of said first current and the simulated first reference resistance value of said switched capacitor element.

12. A continuous time filter circuit comprising a transconductance $g_m$ stage and a load capacitor $C_L$ coupled thereto, said transconductance $g_m$ stage containing a transconductance element which produces an output current $I_{gm}$, that is proportional to a voltage applied to an input terminal thereof, said output current $I_{gm}$ being applied to an output terminal of said transconductance stage to which said load capacitor $C_L$ is coupled and from which an output voltage Vout is derived, such that said continuous time circuit has a corner frequency defined by a ratio of $g_m$ to $C_L$, and wherein said transconductance stage includes a switched capacitor-configured sampled data resistor through which the transconductance $g_m$ of said transconductance stage and thereby said corner frequency is defined, said switched capacitor-configured sampled data resistor being is controlled at a switching frequency f, whereby said corner frequency is proportional to said switching frequency f and is effectively independent of absolute capacitance.

13. A method of manufacturing a continuous time integrated circuit comprising the steps of:
(a) defining the configuration of said continuous time integrated circuit to include a transconductance $g_m$ stage and a load capacitor $C_L$ coupled thereto, said transconductance $g_m$ stage containing a transconductance element which, in response to an input voltage applied thereto, is operative to produce an output current $I_{gm}$, so that said output current $I_{gm}$ being is coupled to an output terminal of said transconductance stage to which said load capacitor $C_L$ is coupled and from which an output voltage Vout is derived, whereby said continuous time circuit has a transfer function Vout/Vin defined by $g_m/sC_L$, and wherein said transconductance stage includes a capacitive component through which the transconductance $g_m$ of said transconductance stage is defined; and (b) forming the continuous time integrated circuit defined in step (a) in a semiconductor wafer, using common processing steps to form said load capacitor and said capacitive component of said transconductance stage, so that process-sensitive capacitance terms in both the numerator and denominator of a transfer function-defining ratio $g_mC_L$ effectively cancel each other, threby making said transfer function of said continuous time integrated circuit effectively independent of absolute capacitance, and insensitive to variations in said common processing steps used to form said load capacitor and said capacitive component of said transconductance stage.

14. A method according to claim 13, wherein said capacitive component of said transconductance stage comprises a switched capacitor element.

15. A method according to claim 14, wherein the configuration of said continuous time integrated circuit is defined in step (a) such that said transconductance stage comprises a first current source, which is coupled in circuit with said switched capacitor element and is operative to apply a first current thereto, and wherein said switched capacitor element is configured to be controlled at a switching frequency effective to cause said switched capacitor element to simulate a first reference resistor, whereby the voltage across said first reference resistor is dependent upon the value of said first reference resistor and said first current, and a voltage translation circuit which applies the value of the voltage across said first reference resistor simulated by said switched capacitor element to an input voltage control path said transconductance stage, said transconductance stage having its output coupled through a second current generator to said input voltage control path of said transconductance stage, said second current generator producing a second current which is proportional to said first current, such that the output current generated by said transconductance stage is proportional to the product of said first current and the simulated first reference resistance value of said switched capacitor element.

16. A method making the corner frequency of a continuous time filter containing a transconductance stage and a load capacitor therefor insensitive to variations in absolute capacitance comprising the steps of:

(a) defining a resistance-based transconductance stage tuning circuit for said transconductance stage, such that a tuning resistor of said transconductance stage is implemented by means of a switched capacitor-configured sampled data resistor; and (b) forming said continuous time filter defined in step (a) in a semiconductor wafer, using common processing steps to form said load capacitor and said switched capacitor-configured sampled data resistor of said transconductance stage, so that process-sensitive capacitance terms in both the numerator and denominator of a transfer function-defining ratio of transconductance to load capacitance effectively cancel each other, thereby making the transfer function of said continuous time filter circuit effectively independent of absolute capacitance, and insensitive to variations in said common processing steps used to form said load capacitor and said switched capacitor-configured sampled data resistor of said transconductance stage.

* * * * *